United States Patent
Yoshida (10) Patent No.: US 11,414,596 B2
(45) Date of Patent: Aug. 16, 2022

(54) FLUORIDE FLUORESCENT MATERIAL, LIGHT EMITTING DEVICE, AND METHOD FOR PRODUCING FLUORIDE FLUORESCENT MATERIAL

(71) Applicant: NICHIA CORPORATION, Anan (JP)

(72) Inventor: Tomokazu Yoshida, Anan (JP)

(73) Assignee: NICHIA CORPORATION, Anan (JP)

(*) Notice: Subject to any disclaimer, the term of this patent is extended or adjusted under 35 U.S.C. 154(b) by 298 days.

(21) Appl. No.: 16/852,388

(22) Filed: Apr. 17, 2020

(65) Prior Publication Data

US 2020/0332187 A1 Oct. 22, 2020

(30) Foreign Application Priority Data

Apr. 19, 2019 (JP) .............. JP2019-080364
May 24, 2019 (JP) .............. JP2019-097604

(51) Int. Cl.

| C09K 11/61 | (2006.01) |
|---|---|
| C09K 11/77 | (2006.01) |
| C09K 11/08 | (2006.01) |
| H01L 33/50 | (2010.01) |
| C01B 33/10 | (2006.01) |

(52) U.S. Cl.
CPC .......... *C09K 11/617* (2013.01); *C01B 33/103* (2013.01); *C09K 11/0883* (2013.01); *C09K 11/7729* (2013.01); *C09K 11/7734* (2013.01); *C09K 11/7774* (2013.01); *H01L 33/504* (2013.01); *C01P 2004/03* (2013.01); *C01P 2004/52* (2013.01); *C01P 2006/11* (2013.01); *C01P 2006/60* (2013.01); *H01L 2933/0041* (2013.01)

(58) Field of Classification Search
CPC ............. C09K 11/0827; C09K 11/0833
USPC .................................................. 257/98
See application file for complete search history.

(56) References Cited

U.S. PATENT DOCUMENTS

| 9,725,510 B2 | 8/2017 | Corbin et al. |
| 9,982,190 B2 | 5/2018 | Murphy et al. |
| 2010/0142189 A1* | 6/2010 | Hong ............. C09K 11/675 362/97.3 |
| 2015/0291878 A1 | 10/2015 | Wakui et al. |
| 2016/0244663 A1 | 8/2016 | Murphy et al. |
| 2018/0244989 A1 | 8/2018 | Murphy et al. |

FOREIGN PATENT DOCUMENTS

| CN | 106318373 A | | 1/2017 |
| CN | 111334282 A | * | 6/2020 |
| JP | 2010209311 A | | 9/2010 |
| JP | 2015052648 A | | 3/2015 |
| JP | 2015-199877 A | | 11/2015 |
| JP | 2016069576 A | | 5/2016 |

(Continued)

*Primary Examiner* — Christopher M Raabe
(74) *Attorney, Agent, or Firm* — Hunton Andrews Kurth LLP (57) ABSTRACT

Provided is a fluoride fluorescent material having high luminance.
The fluoride fluorescent material has a composition containing Mn, A that is at least one element or ion selected from the group consisting of alkali metal elements and $NH_4^+$, at least one element M selected from the group consisting of Group-4 elements and Group-14 elements, and F; and contains spherical fluoride particles.

17 Claims, 6 Drawing Sheets

(56) References Cited

FOREIGN PATENT DOCUMENTS

| | | | |
|---|---|---|---|
| JP | 2016092401 A | | 5/2016 |
| JP | 2016216588 A | | 12/2016 |
| JP | 2016216706 A | | 12/2016 |
| JP | 2018507296 A | | 3/2018 |
| JP | 3216087 U | | 5/2018 |
| JP | 2019102565 A | | 6/2019 |
| JP | 202231338 A | * | 2/2022 |
| WO | 2017057074 A1 | | 4/2017 |

* cited by examiner

FLUORIDE FLUORESCENT MATERIAL, LIGHT EMITTING DEVICE, AND METHOD FOR PRODUCING FLUORIDE FLUORESCENT MATERIAL

CROSS-REFERENCE TO RELATED PATENT APPLICATION

This application claims priority to Japanese Patent Application No. 2019-080364, filed on Apr. 19, 2019, and Japanese Patent Application No. 2019-097604, filed on May 24, 2019, the entire disclosures of which are hereby incorporated by references in their entirety.

BACKGROUND

Technical Field

The present disclosure relates to a fluoride fluorescent material, a light emitting device using the same, and a method for producing a fluoride fluorescent material. In this specification, the "fluorescent material" is used in the same meaning as a "fluorescent phosphor".

Description of Related Art

Various light emitting devices that emit white light, bulb color light, orange light by a combination of a light emitting element such as a light emitting diode (LED), and a fluorescent material have been developed. Such light emitting devices are being used in a wide variety of fields including general illuminations, in-vehicle lightings, displays, backlights for liquid crystal devices. For example, the fluorescent material that is used in a light emitting device for the purpose of a backlight for a liquid crystal display device is demanded to have good color purity, that is, a narrow full width at half maximum of the light emission peak in order to reproduce a wide range of colors on the chromaticity coordinates. The full width at half maximum refers to a full width at half maximum (FWHM) of the light emission peak in the light emission spectrum, and means a wavelength width of the light emission peak at 50% of the maximum value of the light emission peak in the light emission spectrum.

As the fluorescent material that emits red light having a narrow full width at half maximum, for example, Japanese Unexamined Patent Publication No. 2010-209311 discloses a fluoride fluorescent material having a composition represented by $K_2SiF_6:Mn^{4+}$.

For the purpose of improving the luminous flux of the light emitting device, it is desired to further improve the luminance of the fluoride fluorescent material.

Accordingly, an object of one embodiment of the present disclosure is to provide a fluoride fluorescent material having improved luminance, a light emitting device using the same, and a method for producing a fluoride fluorescent material.

SUMMARY

The present disclosure includes the following embodiments.

A first embodiment of the present disclosure relates to a fluoride fluorescent material having a composition containing Mn, A that is at least one element or ion selected from the group consisting of alkali metal elements and $NH_4^+$, at least one element M selected from the group consisting of Group-4 elements and Group-14 elements, and F; and containing spherical fluoride particles.

A second embodiment of the present disclosure relates to a light emitting device including a first fluorescent material containing the fluoride fluorescent material of the present disclosure and an excitation light source having a light emission peak wavelength in a range of 380 nm or more and 485 nm or less.

A third embodiment of the present disclosure relates to a method for producing a fluoride fluorescent material including: preparing a first solution containing hydrogen fluoride and at least A which is at least one element or ion selected from the group consisting of alkali metal elements and $NH_4^+$, a second solution containing hydrogen fluoride and at least a first complex ion including tetravalent manganese and fluorine, and a third solution containing at least a second complex ion including fluorine and at least one element M selected from the group consisting of Group-4 elements and Group-14 elements; and dropping the second solution and the third solution into the first solution respectively to obtain fluoride particles, wherein a ratio of a drop amount of each of the second solution and the third solution at each drop point is 0.020% by volume or less per minute for each of the second solution and the third solution relative to an amount of the first solution by volume as 100%.

In accordance with the embodiments of present disclosure, a fluoride fluorescent material having improved luminance, a light emitting device using the same, and a method for producing a fluoride fluorescent material can be provided.

DETAILED DESCRIPTION

The fluoride fluorescent material, the light emitting device, and the method for producing a fluoride fluorescent material according to the present disclosure will be hereunder described on the basis of embodiments. The embodiments described below are exemplifications for embodying the technical idea of the present disclosure, and the present disclosure is not limited to the fluoride fluorescent material, the light emitting device, and the method for producing a fluoride fluorescent material shown below. Standards according to Japanese Industrial Standard (JIS) Z8110 are applied to the relations between color names and chromaticity coordinates, the relations between wavelength ranges of light and color names of monochromatic lights.

Fluoride Fluorescent Material

The fluoride fluorescent material has a composition containing Mn, A which is at least one element or ion selected from the group consisting of alkali metal elements and $NH_4^+$, at least one element M selected from the group consisting of Group-4 elements and Group-14 elements, and F; and contains spherical fluoride particles. In the present specification, the term "spherical" in the "spherical fluoride particles" refers to a cubic shape including from a sphere (true sphere) that is a true circular rotating body to an ellipsoid (long sphere and oblate sphere) that is an elliptic rotating body. The "spherical" fluoride fluorescent material preferably has a circularity described later in a range of 0.80 or more and 1 or less.

The fluoride fluorescent material preferably has a composition represented by the following formula (I).

$$A_b[M_{1-a}Mn^{4+}{}_aF_6] \quad (I)$$

wherein A represents at least one element or ion selected from the group consisting of alkali metal elements and $NH_4^+$; M represents at least one element selected from the group consisting of Group-4 elements and Group-14 elements; a satisfies $0<a<0.2$; and b is an absolute value of an electric charge of a complex ion represented by $[M_{1-a}Mn^{4+}{}_aF_6]$.

In the formula (I), A (hereinafter also referred to as "A element" or "A ion") is preferably at least one element or ion selected from the group consisting of K, Li, Na, Rb, Cs, and $NH_4^+$, more preferably at least one element or ion selected from the group consisting of K, Na, and $NH_4^+$, even more preferably K.

In the formula (I), M is at least one element (hereinafter also referred to as "M element") selected from the group consisting of Group-4 elements and Group-14 elements, and is preferably at least one element selected from the group consisting of Si, Ge, Sn, Ti, Zr, and Hf, more preferably at least one element selected from the group consisting of Si, Ge, Ti, and Zr, even more preferably Si.

In the formula (I), the parameter a represents a molar ratio of $Mn^{4+}$ that is an activating element in 1 mol of the composition represented by the formula (I). In the formula (I), the parameter a is in a range of more than 0 and less than 0.2 ($0<a<0.2$), and is preferably in a range of 0.005 or more and 0.150 or less ($0.005 \le a \le 0.150$), more preferably in a range of 0.010 or more and 0.100 or less ($0.010 \le a \le 0.100$), even more preferably in a range of 0.015 or more and 0.090 or less ($0.015 \le a \le 0.090$). In the formula (I), the parameter b is the absolute value of an electric charge of a complex ion represented by $[M_{1-a}Mn^{4+}{}_aF_6]$, and is preferably in a range of more than 1.5 and less than 2.5 ($1.5<b<2.5$), more preferably in a range of 1.8 or more and 2.2 or less ($1.8 \le b \le 2.2$).

The circularity of the fluoride particles constituting the fluoride fluorescent material is preferably 0.80 or more, more preferably 0.81 or more, even more preferably 0.82 or more, particularly preferably 0.83 or more. The closer the circularity of the fluoride particles is to 1, the more similar the shape is a true sphere. The circularity of the fluoride particles constituting the fluoride fluorescent material is preferably 1 or less. When the circularity of the fluoride particles constituting the fluoride fluorescent material is 0.80 or more, the fluoride fluorescent material becomes spherical, and is able to efficiently absorb excitation light to further enhance the luminance. The circularity may be determined by analyzing a fluoride particle image obtained with an optical microscope or the like. For example, the circularity may be determined as follows: an area S and a peripheral length L of each of projected images of 4,000 or more fluoride particles are determined using, for example, an optical microscope to calculate a circularity $4\pi S/L^2$, and the circularity may be determined from the arithmetic average value of the number of particles. The circularity may be determined using, for example, a particle image analyzer (product name: Morphologi G3S, manufactured by Malvern Panalytical Ltd.).

The fluoride fluorescent material preferably has a bulk density of 1.50 g/cm³ or more, more preferably 1.52 g/cm³ or more, even more preferably 1.55 g/cm³ or more. The bulk density of the fluoride fluorescent material is a value obtained by dividing the mass of the fluoride fluorescent material when the fluoride fluorescent material is filled in a certain volume by the volume thereof. The larger the bulk density is, the more densely filled the fluoride fluorescent material is in a certain volume. When the bulk density of the fluoride fluorescent material is 1.50 g/cm³ or more, the fluoride fluorescent material readily absorbs excitation light, and the luminance thereof can be further increased. The bulk density of the fluoride fluorescent material is a numerical value obtained by dividing the mass per unit volume, that is, the mass (g) of the fluoride fluorescent material by the volume (cm³) thereof. The bulk density of powder may be determined by measuring the volume of a powder sample having a known mass placed in a graduated cylinder, or by measuring the mass of a powder sample having a known volume placed in a container through a volume meter, or by using a dedicated measuring container. The bulk density is preferably determined by the method using a graduated cylinder since the method is simple. An example of the method using a graduated cylinder will be hereunder described. First, a sufficient amount of the sample is prepared for measurement, and passed through a sieve as necessary. Next, a required amount of the sample is placed in a dry graduated cylinder having a certain capacity. Here, the upper surface of the sample is leveled as necessary. These operations are performed gently so as not to affect the physical properties of the sample. Then, the volume of the sample placed in the graduated cylinder is read to the minimum scale unit, the mass of the sample is measured, and the mass of the sample per unit volume is calculated to determine a bulk density. The bulk density is preferably measured repeatedly, and it is more preferable that the bulk density is measured a plurality of times to determine an arithmetic average value of the measured values.

The fluoride fluorescent material preferably has a particle diameter ratio Db/Dm of an average particle diameter Db, as measured according to a Fisher Sub-Sieve Sizer method (hereinafter also referred to as "FSSS method"), relative to a volume median diameter Dm, as measured according to a laser diffraction particle size distribution measuring method, of 0.85 or more. The laser diffraction particle size distribution measuring method is a method for measuring a distribution of particle size irrespective of primary particles and secondary particles by using scattered laser light radiated to the particles. The volume median diameter Dm means a volume median diameter where the cumulative frequency reaches 50% from the small diameter side in the particle size distribution measured by the laser diffraction particle size distribution measuring method. The FSSS method is a type of an air permeability method, and is a method for measuring a specific surface area by utilizing air flow resistance to mainly determine a particle diameter of primary particles. The average particle diameter Db measured by the FSSS method is a Fisher Sub-Sieve Sizer's number. The closer the value of the particle diameter ratio Db/Dm is to 1, the smaller the amount of secondary particles contained is, and the higher the ratio of primary particles contained in the powder becomes. The particle diameter ratio Db/Dm can also be used as an index representing the dispersibility of fluoride fluorescent material particles, for example, in a resin. When the fluoride fluorescent material has a large particle diameter and the dispersibility in the resin is low, it may be difficult to increase the luminous flux of a light emitting device. On the other hand, when the dispersibility of the fluoride fluorescent material is good and the ratio of primary particles is large, a light emitting device that efficiently absorbs light emitted from a light source and emits light with high luminous flux can be obtained. The particle diameter ratio Db/Dm of the fluoride fluorescent material is more preferably 0.90 or more, even more preferably 0.92 or more, and is generally 1 or less.

The volume median diameter Dm of the fluoride fluorescent material, as measured according to the laser diffraction particle size distribution measuring method, is preferably in a range of 65 µm or more and 115 µm or less, more preferably in a range of 68 µm or more and 110 µm or less, even more preferably in a range of 70 µm or more and 105 µm or less. Even in the case where the volume median diameter Dm of the fluoride fluorescent material particles is in a range of 65 µm or more and 120 µm or less and the particle diameter of the fluorescent material is large, when a composition containing a resin and the fluoride fluorescent material is potted on a molded body using a syringe to form a fluorescent member of a light emitting device, the composition can be potted with the fluorescent material dispersed in the resin without clogging the fluoride fluorescent material in the syringe as long as the circularity is 0.80 or more and the particle diameter ratio Db/Dm is 0.85 or more. Thereby, the light emitting device can be easily produced, and the luminous flux of the obtained light emitting device can be enhanced.

The average particle diameter Db of the fluoride fluorescent material, as measured according to the FSSS method, is preferably in a range of 55 µm or more and 110 µm or less, more preferably in a range of 60 µm or more and 105 µm or less, even more preferably in a range of 65 µm or more and 100 µm or less. Even in the case where the average particle diameter Db of the fluoride fluorescent material particles, as measured according to the FSSS method, is in a range of 55 µm or more and 110 µm or less and the particle diameter of the fluoride fluorescent material is large, a resin composition containing the fluoride fluorescent material and a resin can be potted with the fluorescent material dispersed in the resin without clogging the fluoride fluorescent material in a syringe as long as the particle diameter ratio Db/Dm is 0.85 or more. Thereby, the light emitting device can be easily produced, and the luminous flux of the obtained light emitting device can be enhanced.

It is preferable for the fluoride fluorescent material to emit light having a light emission peak wavelength in a range of 610 nm or more and 650 nm or less by light emitted from an excitation light source having a light emission peak wavelength in a range of 380 nm or more and 485 nm or less, and it is more preferable to emit light having a light emission peak wavelength in a range of 620 nm or more and 640 nm or less. In the light emission spectrum of the fluoride fluorescent material, the full width at half maximum is preferably narrow, and specifically 10 nm or less.

Light Emitting Device

The light emitting device includes the aforementioned fluoride fluorescent material and a excitation light source having a light emission peak wavelength in a range of 380 nm or more and 485 nm or less, and may include a second fluorescent material having a light emission peak wavelength in a range of 495 nm or more and 590 nm or less. Thereby, a wide range of colors in the chromaticity coordinates can be reproduced, and mixed light excellent in color reproducibility can be emitted.

Excitation Light Source

The light source for exciting a fluorescent material (hereinafter also referred to as "excitation light source") preferably has a light emission peak wavelength in a range of 420 nm or more and 485 nm or less, and more preferably has a light emission peak wavelength in a range of 440 nm or more and 480 nm or less, since a fluorescent material containing the fluoride fluorescent material can be efficiently excited to utilize the visible light effectively. As the excitation light source, for example, a light emitting element using a nitride-based semiconductor ($In_XAl_YGa_{1-X-Y}N$, $0 \leq X$, $0 \leq Y$, $X+Y \leq 1$) is preferably used. The use of a light emitting element as the excitation light source may provide a light emitting device that has high efficiency, high linearity of output with respect to input, and high stability against mechanical impacts. The full width at half maximum of the light emission peak in the light emission spectrum of the light emitting element is preferably, for example, 30 nm or less.

Fluorescent Material

In the light emitting device, the aforementioned fluoride fluorescent material and optionally the aforementioned second fluorescent material may be contained, for example, in a fluorescent member that covers the excitation light source. In the light emitting device having the excitation light source covered with the fluorescent member containing the fluoride fluorescent material and optionally the second fluorescent material, a part of light emitted from the excitation light source is absorbed by the fluoride fluorescent material and optionally the second fluorescent material, and mixed color light of blue light emitted from the excitation light source, red light emitted from the fluoride fluorescent material, and optionally green light emitted from the second fluorescent material is emitted from the light emitting device.

Second Fluorescent Material

The light emitting device may include a second fluorescent material having a light emission peak wavelength in a wavelength range different from that of the fluoride fluorescent material, in addition to the fluoride fluorescent material. As the second fluorescent material other than the fluoride fluorescent material, a fluorescent material that absorbs light emitted from the light source and emits light having a light emission peak wavelength in a range different from that of the fluoride fluorescent material may be used. The second fluorescent material may have a light emission peak wavelength in a range of 495 nm or more and 590 nm or less.

The second fluorescent material is preferably at least one kind selected from the group consisting of a β-SiAlON fluorescent material, a halosilicate fluorescent material, a silicate fluorescent material, a rare earth aluminate fluorescent material, and a sulfide fluorescent material.

The second fluorescent material is preferably at least one kind selected from the group consisting of a β-SiAlON fluorescent material having a composition represented by the following formula (IIa), a halosilicate fluorescent material having a composition represented by the following formula (IIb), a silicate fluorescent material having a composition represented by the following formula (IIc), a rare earth aluminate fluorescent material having a composition represented by the following formula (IId), and a sulfide fluorescent material having a composition represented by the following formula (IIe).

$$S_{6-t}Al_tO_tN_{8-t}:Eu \quad \text{(IIa)}$$

wherein t satisfies 0<t<4.2.

$$(Ca,Sr,Ba)_8MgSi_4O_{16}(F,Cl,Br)_2:Eu \quad \text{(IIb)}$$

$$(Ba,Sr,Ca,Mg)_2SiO_4:Eu \quad \text{(IIc)}$$

$$(Y,Lu,Gd,Tb)_3(Al,Ga)_5O_{12}:Ce \quad \text{(IId)}$$

$$(Ba,Sr,Ca)Ga_2S_4:Eu \quad \text{(IIe)}$$

Here, in each of the formulae representing the compositions of the fluorescent materials, plural elements sectioned by the comma (,) mean that at least one element of these plural elements is contained in the composition. In the present specification, in each of the formulae representing the compositions of the fluorescent materials, the part before the colon (:) represents elements and the molar ratio constituting a host crystal, and the part after the colon (:) represents an activating element.

Figure 1:
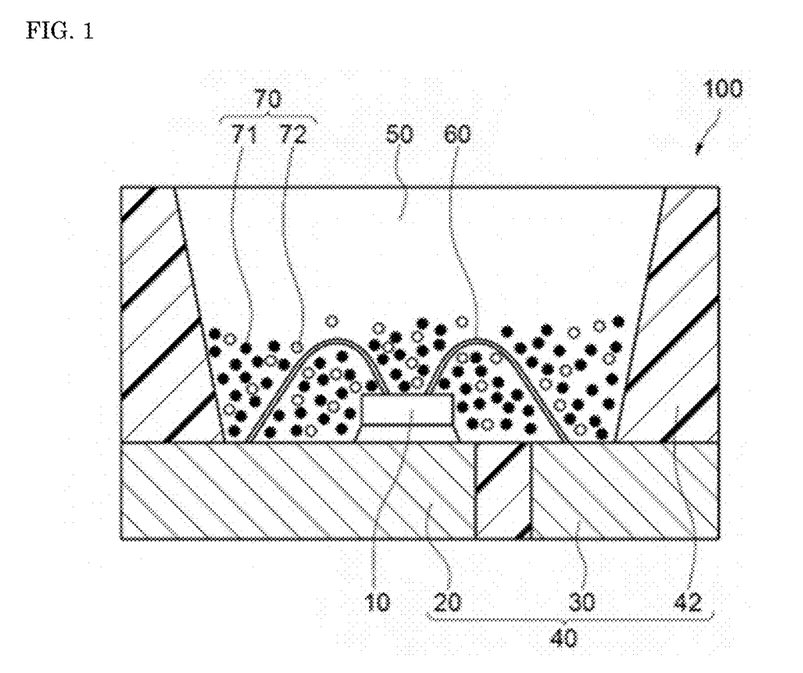
FIG. 1 is a schematic cross-sectional view showing one example of a light emitting device using a fluoride fluorescent material according to the present disclosure.

One example of the light emitting device will be hereunder described with reference to the drawing. FIG. 1 is a schematic cross-sectional view showing one example of the light emitting device. The light emitting device is one example of a surface-mounted light emitting device.

The light emitting device 100 has a light emitting element 10 that emits light having a light emission peak wavelength on the short wavelength side of the visible light (for example, in a range of 380 nm or more and 485 nm or less), and a molded body 40 having the light emitting element 10 disposed thereon. The molded body 40 has a first lead 20 and a second lead 30, which are integrally molded with a thermoplastic resin or a thermosetting resin. The molded body 40 has a concave part having a bottom surface and side surfaces, and the light emitting element 10 is disposed on the bottom surface of the concave part. The light emitting element 10 has a pair of positive and negative electrodes, and the pair of positive and negative electrodes each are individually electrically connected to the first lead 20 and the second lead 30 via wires 60. The light emitting element 10 is sealed with a fluorescent member 50. The fluorescent member 50 contains a fluorescent material 70 containing a fluoride fluorescent material that undergoes wavelength conversion of light emitted from the light emitting element 10. The fluorescent material 70 contains the fluoride fluorescent material as a first fluorescent material 71, and contains a second fluorescent material 72 that emits light having a light emission peak wavelength in a wavelength range different from that of the fluoride fluorescent material by excitation light emitted from the light emitting element 10.

The fluorescent member contains a resin and a fluorescent material, and examples of the resin constituting the fluorescent member may include a silicone resin and an epoxy resin. The fluorescent member may further contain a light diffusing material, such as silica, titanium oxide, zinc oxide, zirconium oxide, or alumina, in addition to the resin and the fluorescent material. By containing a light diffusing material, the directivity from the light emitting element is relaxed, and the viewing angle can be thereby enlarged.

Method for Producing Fluoride Fluorescent Material

The method for producing a fluoride fluorescent material includes: preparing a first solution containing at least A which is at least one element or ion selected from the group consisting of alkali metal elements and $NH_4^+$, and hydrogen fluoride, a second solution containing at least a first complex ion including tetravalent manganese and fluorine, and hydrogen fluoride, and a third solution containing at least a second complex ion including at least one element M selected from the group consisting of Group-4 elements and Group-14 elements and fluorine; and dropping the second solution and the third solution into the first solution respectively to obtain fluoride particles. Here, the ratio of the drop amount of each of the second solution and the third solution at each drop point relative to 100% by volume of the first solution amount is 0.020% by volume or less per minute for each of the second solution and the third solution. The fluoride particles obtained according to the method for producing a fluoride fluorescent material are spherical and constitute the fluoride fluorescent material. The fluoride fluorescent material composed of the obtained fluoride particles preferably has a composition represented by the formula (I).

First Solution

The first solution (hereinafter also referred to as "solution A") contains at least A which is at least one element or ion selected from the group consisting of alkali metal elements and $NH_4^+$, and hydrogen fluoride. The element or ion A is preferably at least one kind selected from the group consisting of Li, Na, K, Rb, and $NH_4^+$, more preferably at least one kind selected from the group consisting of Li, Na, K, and $NH_4^+$, even more preferably at least one kind selected from $NH_4^+$, the group consisting of Li, Na, and K. The first solution may be obtained, for example, as an aqueous solution of hydrofluoric acid containing lithium ions, sodium ions, potassium ions, rubidium ions, or ammonium ions. Examples of the compound containing an alkali metal element or $NH_4^+$ contained in the first solution may include water-soluble compounds such as halides, hydrofluorides, hydroxides, acetates, and carbonates.

Specific examples of the potassium compound may include water-soluble potassium salts such as KF, $KHF_2$, KOH, KCl, KBr, KI, potassium acetate, and $K_2CO_3$. Examples of the compound containing at least one element or ion selected from the group consisting of alkali metal elements and $NH_4^+$ other than the potassium compound may include water-soluble salts such as NaF, NaF.HF, NaOH, NaCl, sodium acetate, $Na_2CO_3$, LiF, LiF.HF, LiOH, LiCl, lithium acetate, $Li_2CO_3$, $NH_4F$, $NH_4F.HF$, $NH_4OH$, $NH_4Cl$, ammonium acetate, and $(NH_4)_2CO_3$. Among these, $KHF_2$, NaF.HF, LiF.HF, $NH_4F.HF$, and the like are preferred since these compounds can be dissolved without lowering the hydrogen fluoride concentration in the solution, and have a low dissolution heat and high safety. The compound containing an element or ion A constituting the first solution may be used alone, or may be used in combination of two or more thereof.

The lower limit of the hydrogen fluoride concentration in the first solution is generally 1% by mass or more, and preferably 30% by mass or more. In addition, the upper limit of the hydrogen fluoride concentration in the first solution is preferably 80% by mass or less, more preferably 75% by mass or less, even more preferably 70% by mass or less. The hydrogen fluoride concentration in the first solution is preferably in a range of 30% by mass or more and 80% by mass or less.

The lower limit of the concentration of element A or ion A in the first solution is preferably 1% by mass or more, more preferably 3% by mass or more, even more preferably 5% by mass or more. In addition, the upper limit of the concentration of element A or ion A in the first solution is preferably 30% by mass or less, more preferably 25% by mass or less, even more preferably 20% by mass or less.

When the concentration of element A or ion A in the first solution is 5% by mass or more, there may be a tendency that the yield of the fluoride particles is improved. The concentration of element A or ion A in the first solution is preferably in a range of 1% by mass or more and 30% by mass or less. When the hydrogen fluoride concentration and the concentration of element A or ion A in the first solution are in the aforementioned ranges, fluoride particles having a circularity close to 1 and a large particle diameter can be obtained.

Second Solution

The second solution (hereinafter also referred to as "solution B") contains at least a first complex ion including tetravalent manganese, and hydrogen fluoride; and may contain other components as necessary. The second solution may be obtained, for example, as an aqueous solution of hydrofluoric acid containing a tetravalent manganese source. The manganese source is a compound containing tetravalent manganese. Specific examples of the manganese source contained in the second solution may include $K_2MnF_6$, $KMnO_4$, and $K_2MnCl_6$. Among these, $K_2MnF_6$ is preferred. This is because the compound does not contain chlorine which tends to destabilize the crystal lattice through distortion, and can be stably present in hydrofluoric acid as an $MnF_6$ complex ion while maintaining the oxidation number (tetravalent) capable of performing the activation. In addition, the manganese source containing an element A or ion A can also serve as the element A or ion A source contained in the first solution. The manganese source constituting the second solution may be used alone, or may be used in combination of two or more thereof.

The lower limit of the hydrogen fluoride concentration in the second solution is generally 1% by mass or more, and preferably 3% by mass or more, more preferably 5% by mass or more. In addition, the upper limit of the hydrogen fluoride concentration in the second solution is generally 80% by mass or less, and preferably 75% by mass or less, more preferably 70% by mass or less.

The lower limit of the first complex ion concentration in the second solution is preferably 0.01% by mass or more, more preferably 0.03% by mass or more, even more preferably 0.05% by mass or more. In addition, the upper limit of the first complex ion concentration in the second solution is preferably 10% by mass or less, more preferably 8% by mass or less, even more preferably 5% by mass or less, still more preferably 4% by mass or less, particularly preferably 3.5% by mass or less. The first complex ion concentration in the second solution is preferably in a range of 0.01% by mass or more and 10% by mass or less. When the first complex ion concentration in the second solution is in the aforementioned range, fluoride particles having a circularity close to 1 and a large particle diameter can be obtained.

Third Solution

The third solution (hereinafter also referred to as "solution C") contains at least a second complex ion including at least one element M selected from the group consisting of Group-4 elements and Group-14 elements and fluorine, and may contain other components as necessary. The third solution may be obtained, for example, as an aqueous solution containing a second complex ion source.

The second complex ion source is preferably a compound that contains a second complex ion including at least one element M selected from the group consisting of Group-4 elements and Group-14 elements and an fluorine ion, and is excellent in solubility in the solution. The element M is preferably at least one element selected from the group consisting of Ti, Zr, Hf, Si, Ge, and Sn, more preferably at least one element selected from the group consisting of Ti, Zr, Si, and Ge, even more preferably at least one element selected from the group consisting of Si and Ge. Specific examples of the second complex ion source containing the element M and fluorine may include $H_2SiF_6$, $Na_2SiF_6$, $(NH_4)_2SiF_6$, $Rb_2SiF_6$, $Cs_2SiF_6$, $H_2GeF_6$, $Na_2GeF_6$, $(NH_4)_2GeF_6$, $Rb_2GeF_6$, $Cs_2GeF_6$, $H_2TiF_6$, $Na_2TiF_6$, $(NH_4)_2TiF_6$, $Rb_2TiF_6$, $Cs_2TiF_6$, $H_2ZrF_6$, $Na_2ZrF_6$, $(NH_4)_2ZrF_6$, $Rb_2ZrF_6$, and $Cs_2ZrF_6$. Among these, $H_2SiF_6$, $H_2GeF_6$, $H_2TiF_6$, and $H_2ZrF_6$ are preferred, and $H_2SiF_6$ and $H_2GeF_6$ are more preferred, since these compounds have high solubility in water and contain no alkali metal element as an impurity. The second complex ion source constituting the third solution may be used alone, or may be used in combination of two or more thereof.

The lower limit of the second complex ion concentration in the third solution is preferably 10% by mass or more, more preferably 15% by mass or more, even more preferably 20% by mass or more. In addition, the upper limit of the second complex ion concentration in the third solution is preferably 60% by mass or less, more preferably 55% by mass or less, even more preferably 50% by mass or less. The second complex ion concentration in the third solution is preferably in a range of 10% by mass or more and 60% by mass or less. When the second complex ion concentration in the third solution is in the aforementioned range, fluoride particles having a circularity close to 1 and a large particle diameter can be obtained.

As the mixing method of the first solution, the second solution, and the third solution, the second solution and the third solution are dropped into the first solution respectively and mixed. For example, the second solution and the third solution may be added and mixed to the first solution under stirring.

When the first solution, the second solution, and the third solution are mixed, the first complex ion, the A ion, and the second complex ion are reacted with each other to deposit desired fluoride particles. The number of drop point of each of the second solution and the third solution to the first solution may be one, or two or more. For the purpose of obtaining fluoride particles having a circularity close to 1 and a large particle diameter by uniformly reacting the second solution and the third solution with the first solution, the second solution and the third solution are preferably dropped from two or more points into the first solution respectively, and may be dropped from three points into the first solution respectively.

As the mixing method of the first solution, the second solution, and the third solution, the second solution and the third solution are dropped into the first solution respectively and mixed. For example, the second solution and the third solution may be added and mixed to the first solution under stirring. The stirring rate is not particularly limited, and the stirring method is also not particularly limited. The stirring method can be appropriately selected from commonly used stirring methods depending on the production amount.

When the first solution, the second solution, and the third solution are mixed, the first complex ion, the A ion, and the second complex ion are reacted with each other to deposit desired fluoride particles. The number of drop point of each of the second solution and the third solution to the first solution may be one, or two or more. For the purpose of obtaining fluoride particles having a circularity close to 1 and a large particle diameter by uniformly reacting the second solution and the third solution with the first solution, the second solution and the third solution are preferably dropped from two or more drop points into the first solution respectively, and may be dropped from three drop points into the first solution respectively.

The ratio of the drop amount of each of the second solution and the third solution at each drop point relative to 100% by volume of the first solution amount is 0.020% by volume or less per minute for each of the second solution and the third solution. By slowly dropping a relatively small amount of each of the second solution and the third solution into the first solution at a rate of 0.020% by volume or less per minute at each drop point, the amount of manganese contained in the fluoride fluorescent material can be increased to enhance the luminance, and spherical fluoride particles having a large particle diameter and a circularity close to 1 can be obtained. For each of the second solution and the third solution, the ratio of the drop amount of each of the second solution and the third solution at each drop point relative to 100% by volume of the first solution amount is preferably 0.015% by volume or less per minute, more preferably 0.012% by volume or less per minute, and is preferably 0.001% by volume or more per minute, more preferably 0.002% by volume or more per minute, even more preferably 0.003% by volume or more per minute. When the ratio of the drop amount of each of the second solution and the third solution relative to 100% by volume of the first solution amount is less than 0.001% by volume per minute, the drop rate is slow and the working efficiency is lowered. The ratio of the drop amount of each of the second solution and the third solution at each drop point relative to 100% by volume of the first solution amount is preferably in a range 0.001% by volume or more and 0.020% by volume or less, more preferably in a range 0.001% by volume or more and 0.015% by volume or less. The drop amount of the second solution and the drop amount of the third solution may be different, or may be the same. In addition, when the second solution or the third solution is dropped from a plurality of drop points, the ratio of the drop amount at each drop point may be different as long as the ratio of the drop amount at each drop point is 0.020% by volume or less per minute.

The volume ratio of the total drop amount of the second solution and the third solution relative to the first solution amount is preferably in a range of 0.4 or more and 1.2 or less, more preferably in a range of 0.5 or more and 1.1 or less, even more preferably in a range of 0.5 or more and 1.0 or less. When the volume ratio of the total drop amount of the second solution and the third solution relative to the first solution amount is in a range of 0.4 or more and 1.2 or less, spherical fluoride particles can be obtained without greatly reducing the working efficiency even in the case where the second solution and the third solution are slowly dropped such that the ratio of the drop amount of each of the second solution and the third solution at each drop point relative to 100% by volume of the first solution amount is 0.020% by volume or less per minute.

The second solution and the third solution are preferably simultaneously dropped into the first solution. In the present specification, the term "simultaneously" means that there is a time during which two or more different solutions are supplied together to a container or another solution in a container, or means that the time for starting supply of two or more different solutions to a container or another solution in a container coincides. In the two or more different solutions, the times to terminate the supply to a container or another solution in a container are preferably the same, but may be somewhat deviated. In addition, when each of the second solution and the third solution is dropped from two or more drop points, the second solution of at least one drop point among the drop points thereof and the third solution of at least one drop point among the drop points thereof may be simultaneously dropped, and the second solution and the third solution may not be simultaneously dropped at all the drop points.

The temperature at which the second solution and the third solution are dropped into the first solution is not particularly limited. The temperature of each of the first solution, the second solution, and the third solution is preferably 40° C. or less, more preferably in a range of 15° C. or more and 30° C. or less. The temperatures of the first solution, the second solution, and the third solution may be different, or may be the same. The temperature difference among the first solution, the second solution, and the third solution is preferably 10° C. or less, more preferably in a range of 1° C. or more and 10° C. or less.

The time for dropping the second solution or the third solution into the first solution is not particularly limited as long as the ratio of the total drop amount of the second solution and the third solution at each drop point relative to the first solution amount is in the aforementioned range. The time for dropping the second solution or the third solution into the first solution is preferably 7 hours or more, more preferably 10 hours or more, and preferably 80 hours or less, more preferably 75 hours or less, even more preferably 70 hours or less, from the viewpoint of obtaining a desired spherical shape and working efficiency.

The second solution and the third solution are dropped into the first solution to deposit fluoride particles, thereby obtaining a fluoride fluorescent material composed of the fluoride particles. The deposited fluoride particles are preferably recovered by solid-liquid separation through filtration or the like. The fluoride particles recovered by the solid-liquid separation may be washed with a washing liquid in order to eliminate impurities. Examples of the washing liquid may include ethanol, isopropyl alcohol, water, and acetone. Among these, water is preferably used since the fluoride salt such as potassium fluoride has high solubility in water. The water is preferably deionized water. The washed fluoride particles may be further subjected to a drying treatment. The drying temperature in the drying treatment is generally 50° C. or more, preferably 55° C. or more, more preferably 60° C. or more; and generally 110° C. or less, preferably 105° C. or less, more preferably 100° C. or less. The drying time may be a time during which the moisture attached to the fluoride particles by washing with the washing liquid can be evaporated, and is, for example, about 10 hours.

EXAMPLES

The present disclosure is hereunder specifically described by reference to the following Examples. The present disclosure is not limited to these Examples.

Light Emitting Device

The fluoride fluorescent material in each of Examples and Comparative Examples described below as a first fluorescent material and the β-SiAlON fluorescent material having a composition represented by the formula (IIa): $Si_{6-t}Al_tO_t$-$N_{8-t}$:Eu (t is 0.19) as a second fluorescent material were dispersed and mixed in a silicone resin, and defoamed to obtain a fluorescent member composition in each of Examples and Comparative Examples described below. The blending ratio of the fluorescent member composition was adjusted such that the mixed color light emitted from the light emitting device to be produced had a chromaticity x of 0.280 and a chromaticity y of 0.270 (x=0.280, y=0.270) on the xy color coordinates of the chromaticity diagram in the Commission International de l'eclarirage (CIE) 1931 color system. A molded body 40 having a concave part as shown in FIG. 1 was prepared, a light emitting element 10 having a gallium nitride-based compound semiconductor, in which the light emission peak wavelength was 451 nm, was disposed on a first lead 20 of the bottom surface of the concave part, the aforementioned fluorescent member resin composition was then injected in the concave part of the molded body 40 using a syringe, and the fluorescent member resin composition was cured to produce a light emitting device 100 as shown in FIG. 1.

Example 1

Production of Fluoride Fluorescent Material

First, a method for producing a fluoride fluorescent material according to Example 1 will be described. $KHF_2$ was weighed in an amount of 7,029 g, and the $KHF_2$ was dissolved in 40.0 L of a 55% by mass HF aqueous solution to prepare a first solution (solution A). In addition, $K_2MnF_6$ was weighed in an amount of 589.1 g, and the $K_2MnF_6$ was dissolved in 12.0 L of a 55% by mass HF aqueous solution to prepare a second solution (solution B). Subsequently, 15.5 L of an aqueous solution containing 40% by mass of $H_2SiF_6$ was prepared to obtain a third solution (solution C). In the first solution, the second solution, and the third solution, deionized water was used as a solvent. While stirring the solution A at room temperature (about 25° C.), the solution B and the solution C were simultaneously dropped thereinto from three drop points each. The starting times of dropping the solution B and the solution C into the solution A were the same at one point in the drop points where the solution B was dropped and one point in the drop points where the solution C was dropped. The drop rate of the solution B at each drop point was 3 mL per minute, and the drop rate of the solution C at each drop point was 4 mL per minute. All the prepared amounts of the solution B and the solution C were dropped into the solution A. The ratio of the drop amount of the solution B at each drop point was 0.008% by volume per minute, and the ratio of the total drop amount of the three drop points of the solution B was 0.023% by volume per minute, relative to 100% by volume of the solution A amount. The ratio of the drop amount of the solution C at each drop point was 0.01% by volume per minute, and the ratio of the total drop amount of the three drop points of the solution C was 0.03% by volume per minute, relative to 100% by volume of the solution A amount. The solution B and the solution C were respectively dropped into the solution A to deposit a precipitate of fluoride particles. The deposited precipitate was solid-liquid separated by filtration, then washed with ethanol, and dried at 90° C. for 10 hours to produce a fluoride fluorescent material composed of the fluoride particles.

Example 2

The same materials as in Example 1 were used except that 7,029 g of $KHF_2$ was weighed and the $KHF_2$ was dissolved in 42.5 L of a 55% by mass HF aqueous solution to prepare a first solution (solution A). The same procedure as in Example 1 was performed except that the ratio of the drop amount of each of the second solution (solution B) and the third solution (solution C) at each drop point relative to the first solution (solution A) amount was changed as described below. The ratio of the drop amount of the solution B at each drop point relative to 100% by volume of the solution A amount was 0.007% by volume per minute. The ratio of the total drop amount of the three drop points of the solution B relative to 100% by volume of the solution A amount was 0.021% by volume per minute. The ratio of the drop amount of the solution C at each drop point relative to 100% by volume of the solution A amount was 0.009% by volume per minute. The ratio of the total drop amount of the three drop points of the solution C relative to 100% by volume of the solution A amount was 0.027% by volume per minute.

Comparative Example 1

The same materials as in Example 1 were used except that 7,029 g of $KHF_2$ was weighed and the $KHF_2$ was dissolved in 45.0 L of a 55% by mass HF aqueous solution to prepare a first solution (solution A). The same procedure as in Example 1 was performed except that the number of drop points, the drop amount at each drop point, and the ratio of the drop amount at each drop point of each of the second solution (solution B) and the third solution (solution C) were changed as described below. The solution B and the solution C were dropped from one drop point each. The drop rate of the solution B at one drop point was 200 mL per minute. The drop rate of the solution C at one drop point was 250 mL per minute. The ratio of the drop amount of the solution B at one drop point relative to 100% by volume of the solution A amount was 0.44% by volume per minute. The ratio of the drop amount of the solution C at one drop point relative to 100% by volume of the solution A amount was 0.55% by volume per minute.

Comparative Example 2

$KHF_2$ was weighed in an amount of 7,029 g, and the $KHF_2$ was dissolved in 47.0 L of a 55% by mass HF aqueous solution to prepare a first solution (solution A). In addition, $K_2MnF_6$ was weighed in an amount of 615.3 g, and the $K_2MnF_6$ was dissolved in 12.0 L of a 55% by mass HF aqueous solution to prepare a second solution (solution B). A third solution (solution C) was prepared in the same manner as in Example 1. The same procedure as in Comparative Example 1 was performed except that these solution A, solution B, and solution C were used, and the ratio of the drop amount of each of the solution B and the solution C at one drop point was changed as described below. The ratio of the drop amount of the solution B at one drop point relative to 100% by volume of the solution A amount was 0.43% by volume per minute. The ratio of the drop amount of the solution C at one drop point relative to 100% by volume of the solution A amount was 0.53% by volume per minute.

Comparative Example 3

$KHF_2$ was weighed in an amount of 7,029 g, and the $KHF_2$ was dissolved in 50.0 L of a 55% by mass HF aqueous solution to prepare a first solution (solution A). In addition, $K_2MnF_6$ was weighed in an amount of 654.6 g, and the $K_2MnF_6$ was dissolved in 12.0 L of a 55% by mass HF aqueous solution to prepare a second solution (solution B). A third solution (solution C) was prepared in the same manner as in Example 1. The same procedure as in Comparative Example 1 was performed except that these solution A, solution B, and solution C were used, and the ratio of the drop amount of each of the solution B and the solution C at one drop point was changed as described below. The ratio of the drop amount of the solution B at one drop point relative to 100% by volume of the solution A amount was 0.40% by volume per minute. The ratio of the drop amount of the solution C at one drop point relative to 100% by volume of the solution A amount was 0.50% by volume per minute.

Evaluation

The evaluation results are shown in Table 1.

Average Particle Diameter Db

As for the resulting fluoride fluorescent material in each of Examples and Comparative Examples, the average particle diameter Db was measured according to the FSSS method, using a Fisher Sub-Sieve Sizer Model 95 (manufactured by Fisher Scientific Inc.).

Volume Median Diameter Dm

As for the resulting fluoride fluorescent material in each of Examples and Comparative Examples, the volume median diameter Dm at a cumulative volume frequency of 50% from the small diameter side was measured using a laser diffraction particle size distribution measuring apparatus (product name: Mastersizer 2000, manufactured by Malvern Panalytical Ltd.)

Circularity

As for the resulting fluoride fluorescent material in each of Examples and Comparative Examples, using a particle image analyzer (product name: Morphologi G3S, manufactured by Malvern Panalytical Ltd.), the area S and peripheral length L of each of projected images of 5,000 fluoride particles obtained with an optical microscope or the like were determined to calculate a circularity $4\pi S/L^2$, and the circularity was determined from the arithmetic average value of the number of particles.

Bulk Density

As for the resulting fluoride fluorescent material in each of Examples and Comparative Examples, a sample having a sufficient amount for measurement was prepared, the sample was filled into a graduated cylinder having a certain capacity while passing through a sieve to measure the mass of the sample, and the bulk density was determined by calculating the mass of the sample per unit volume.

Light Emission Spectrum and Relative Luminance

Using a fluorospectrophotometer (product name: QE-2000, manufactured by Otsuka Electronics Co., Ltd.), the resulting fluoride fluorescent material in each of Examples and Comparative Examples was irradiated with excitation light having a light emission peak wavelength of 450 nm, and the light emission spectrum of each fluoride fluorescent material was measured at room temperature.

From the data of the light emission spectrum measured for the fluoride fluorescent material in each of Examples and Comparative Examples, the relative luminance of the fluoride fluorescent material in each of Examples and Comparative Examples was determined when the luminance of the fluoride fluorescent material in Comparative Example 1 was defined as 100%.

Chromaticities x,y

As for the fluoride fluorescent material in each of Examples and Comparative Examples, the chromaticity x and the chromaticity y on the xy color coordinates in the CIE 1931 color system were determined from the measured light emission spectrum data.

Mn Amount (Parameter a)

As for the fluoride fluorescent material in each of Examples and Comparative Examples, the content of Mn was measured using an X-ray fluorescence (XRF) spectrometer (product name: ZSX Primus II, manufactured by Rigaku Corp.) according to the XRF analysis method, and the molar ratio of Mn (parameter a) in 1 mol of the composition represented by the formula (I) was determined.

Relative Luminous Flux

The luminous flux of the light emitting device using the fluoride fluorescent material in each of Examples and Comparative Examples was measured using a total luminous flux measuring apparatus with an integrating sphere. The relative luminous flux of the light emitting device using the fluoride fluorescent material in each of Examples and Comparative Examples was determined when the luminous flux of the light emitting device using the fluoride fluorescent material according to Comparative Example 1 was defined as 100%.

SEM Micrograph

Figure 2:
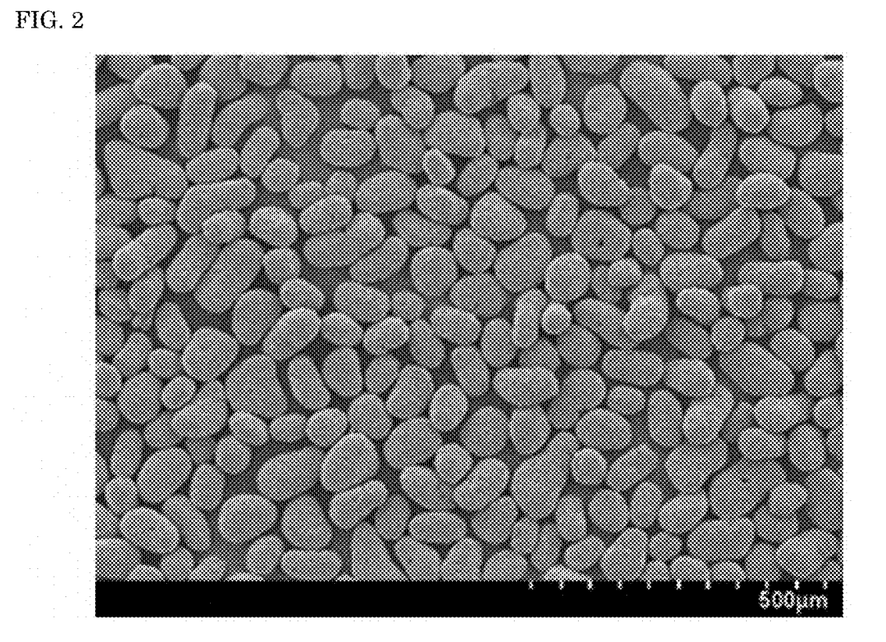
FIG. 2 is a scanning electron microscope (SEM) micrograph of a fluoride fluorescent material according to Example 1 of the present disclosure.
Figure 3:
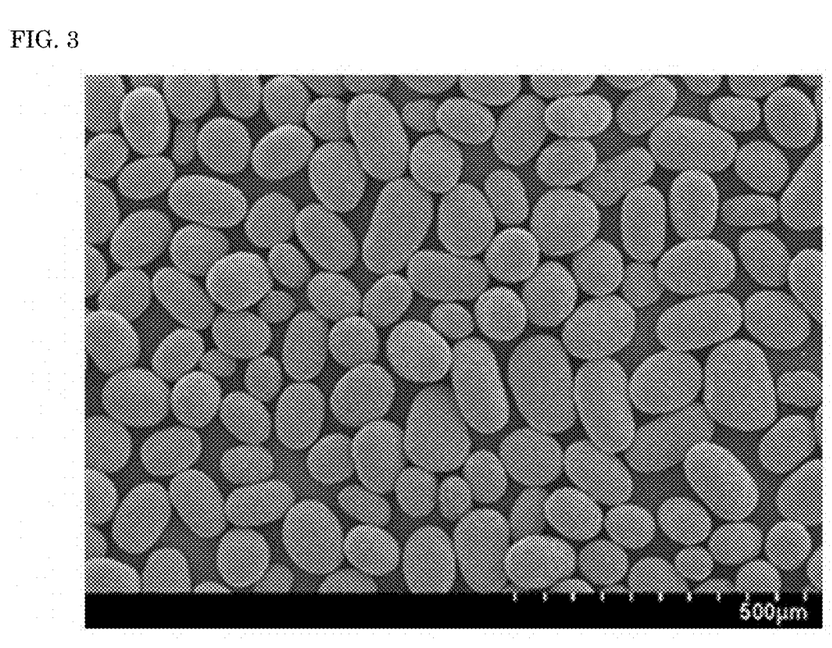
FIG. 3 is a SEM micrograph of a fluoride fluorescent material according to Example 2 of the present disclosure.
Figure 4:
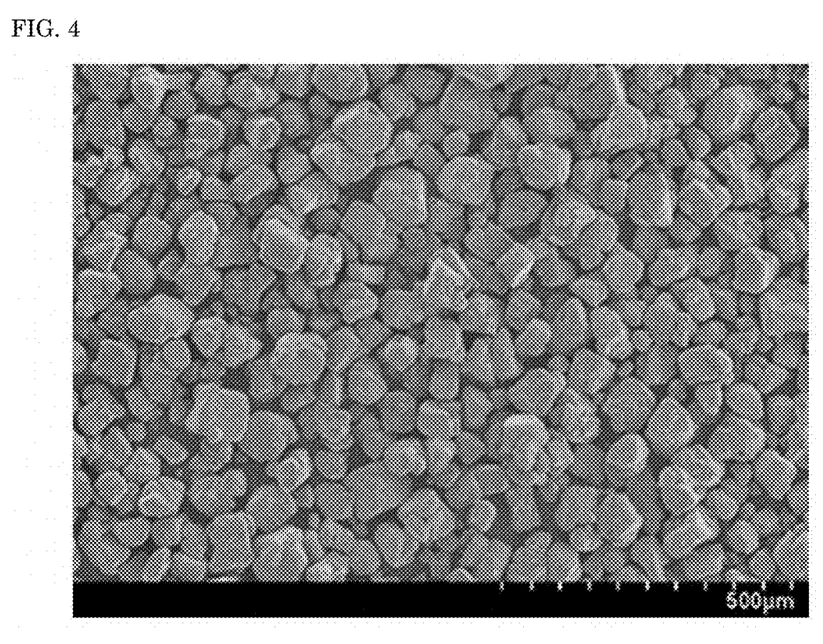
FIG. 4 is a SEM micrograph of a fluoride fluorescent material according to Comparative Example 1 of the present disclosure.
Figure 5:
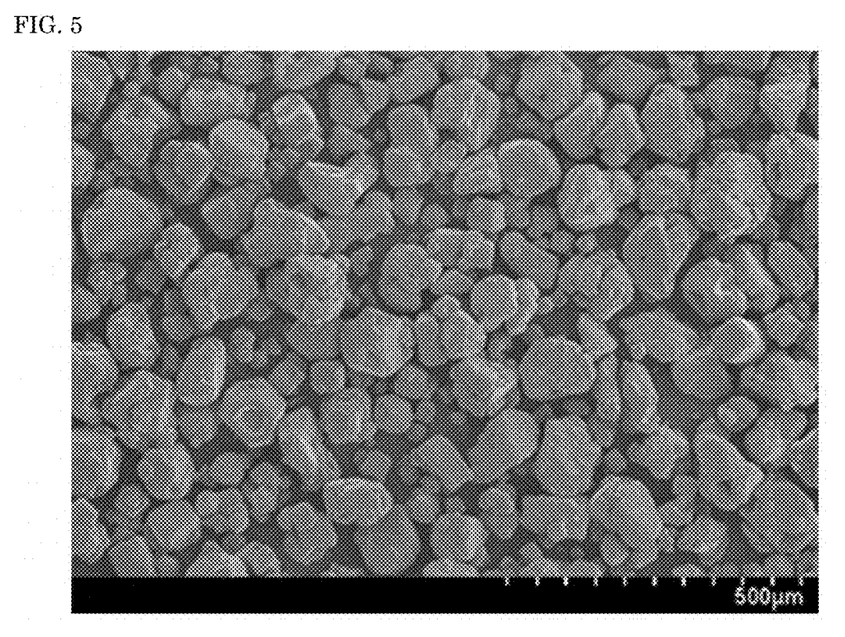
FIG. 5 is a SEM micrograph of a fluoride fluorescent material according to Comparative Example 2 of the present disclosure.
Figure 6:
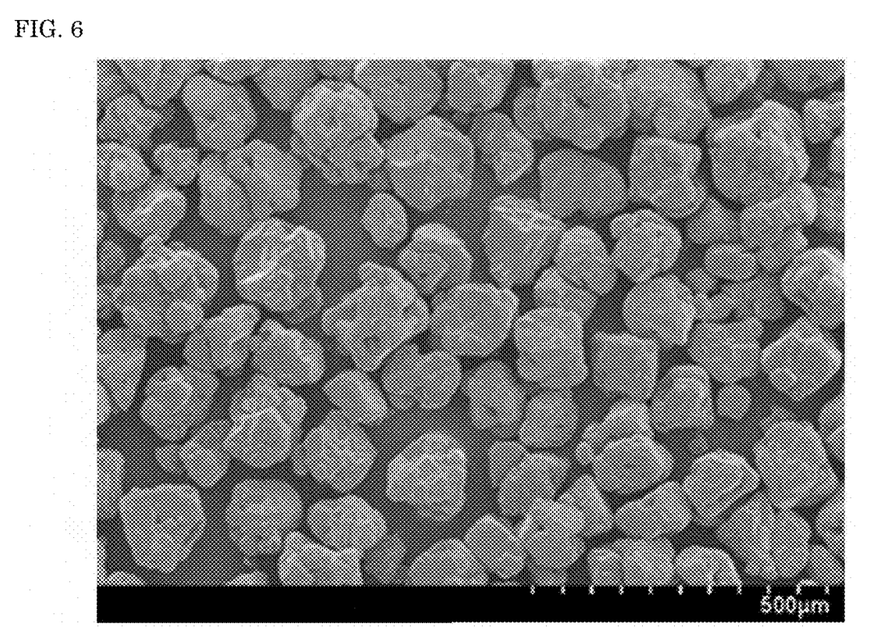
FIG. 6 is a SEM micrograph of a fluoride fluorescent material according to Comparative Example 3 of the present disclosure.

SEM micrographs of the fluoride fluorescent materials were obtained using a scanning electron microscope (SEM). FIG. 2 shows a SEM micrograph of the fluoride fluorescent material in Example 1; FIG. 3 shows a SEM micrograph of the fluoride fluorescent material in Example 2; FIG. 4 shows a SEM micrograph of the fluoride fluorescent material in Comparative Example 1; FIG. 5 shows a SEM micrograph of the fluoride fluorescent material in Comparative Example 2; and FIG. 6 shows a SEM micrograph of the fluoride fluorescent material in Comparative Example 3.

TABLE 1

| | Production Process | | Fluoride Fluorescent Material | | | | | | | | | | Light Emitting Device |
|---|---|---|---|---|---|---|---|---|---|---|---|---|---|
| | Second Solution (solution B) Ratio of Drop Amount (% by volume/minute) | Third Solution (solution C) Ratio of Drop Amount (% by volume/minute) | Average Particle Diameter Db (μm) | Volume Median Diameter Dm (μm) | Particle Diameter Ratio Db/Dm | Mn Parameter a (molar ratio) | Mn (%) | Circularity | Bulk Density (g·cm$^{-3}$) | x | y | Relative Luminance (%) | Relative Luminous Flux (%) |
| Example 1 | 0.008 | 0.010 | 68.5 | 72.8 | 0.94 | 0.023 | 0.57 | 0.831 | 1.55 | 0.695 | 0.305 | 105.6 | 101.6 |
| Example 2 | 0.007 | 0.009 | 95.0 | 98.4 | 0.97 | 0.025 | 0.61 | 0.856 | 1.59 | 0.696 | 0.305 | 109.3 | 101.8 |
| Comparative Example 1 | 0.440 | 0.550 | 60.0 | 83.2 | 0.72 | 0.024 | 0.60 | 0.703 | 1.26 | 0.696 | 0.304 | 100.0 | 100.0 |
| Comparative Example 2 | 0.430 | 0.530 | 75.0 | 100.8 | 0.74 | 0.024 | 0.59 | 0.704 | 1.39 | 0.696 | 0.303 | 100.7 | 99.9 |
| Comparative Example 3 | 0.400 | 0.500 | 98.0 | 134.0 | 0.73 | 0.024 | 0.60 | 0.701 | 1.34 | 0.697 | 0.303 | 102.8 | — |

The fluoride fluorescent material in each of Examples 1 and 2 had a circularity of 0.80 or more. The fluoride fluorescent material in each of Examples 1 and 2 had a particle diameter ratio Db/Dm of 0.85 or more, a bulk density of 1.50 g/cm³ or more, and a relative luminance higher than that in each of Comparative Examples 1 to 3. Also, the light emitting device using the fluoride fluorescent material in each of Examples 1 and 2 had a luminous flux higher than that in each of Comparative Examples 1 and 2.

The fluoride fluorescent material in each of Comparative Examples 1 to 3 had a circularity of 0.75 or less, a particle diameter ratio Db/Dm of 0.80 or less, and a bulk density lower than that in each Example. The fluoride fluorescent material in each of Comparative Examples 1 to 3 had a relative luminance lower than that in each of Examples 1 and 2. Also, the light emitting device using the fluoride fluorescent material in each of Comparative Examples 1 to 3 had a relative luminous flux lower than the light emitting device using the fluoride fluorescent material in each of Examples 1 and 2.

As shown in the SEM micrographs of FIGS. 2 and 3, the fluoride fluorescent material in each of Examples 1 and 2 contained spherical fluoride particles that were spheres or ellipsoids. On the other hand, as shown in the SEM micrographs of FIGS. 4 to 6, the fluoride particles contained in the fluoride fluorescent material in each of Comparative Examples 1 to 3 had an angular shape, which is close to a rectangular parallelepiped rather than a sphere or ellipsoid, and the shape thereof was clearly different from that of the fluoride particles in each of Examples 1 and 2.

The fluoride fluorescent material of the present disclosure can be suitably applied particularly to illumination light sources using a light emitting diode as an excitation light source, image display device light sources for LED displays and liquid crystal backlights, traffic signals, illuminated switches, various sensors, various indicators, small-sized strobe lights.

The invention claimed is:

1. A fluoride fluorescent material, having a composition comprising Mn, A that is at least one element or ion selected from the group consisting of alkali metal elements and $NH_4^+$, at least one element M selected from the group consisting of Group-4 elements and Group-14 elements, and F; and comprising spherical fluoride particles.

2. The fluoride fluorescent material according to claim 1, having a composition represented by the following formula (I):

$$A_b[M_{1-a}Mn^{4+}_aF_6] \quad (I)$$

wherein A represents at least one element or ion selected from the group consisting of alkali metal elements and $NH_4^+$; M represents at least one element selected from the group consisting of Group-4 elements and Group-14 elements; a satisfies 0<a<0.2; and b is an absolute value of an electric charge of a complex ion represented by $[M_{1-a}Mn^{4+}_aF_6]$.

3. The fluoride fluorescent material according to claim 1, wherein a circularity thereof is 0.80 or more.

4. The fluoride fluorescent material according to claim 1, wherein a bulk density thereof is 1.50 g/cm³ or more.

5. The fluoride fluorescent material according to claim 1, wherein a particle diameter ratio (Db/Dm) of an average particle diameter (Db), as measured according to a Fisher Sub-Sieve Sizer method, relative to a volume median diameter (Dm), as measured according to a laser diffraction particle size distribution measuring method, is 0.85 or more.

6. The fluoride fluorescent material according to claim 2, wherein a circularity thereof is 0.80 or more.

7. The fluoride fluorescent material according to claim 2, wherein a bulk density thereof is 1.50 g/cm³ or more.

8. The fluoride fluorescent material according to claim 2, wherein a particle diameter ratio (Db/Dm) of an average particle diameter (Db), as measured according to a Fisher Sub-Sieve Sizer method, relative to a volume median diameter (Dm), as measured according to a laser diffraction particle size distribution measuring method, is 0.85 or more.

9. A light emitting device, including
 a first fluorescent material comprising the fluoride fluorescent material according to claim 1, and
 an excitation light source having a light emission peak wavelength in a range of 380 nm or more and 485 nm or less.

10. The light emitting device according to claim 9, including a second fluorescent material having a light emission peak wavelength in a range of 495 nm or more and 590 nm or less.

11. The light emitting device according to claim 10, wherein the second fluorescent material is at least one kind selected from the group consisting of a β-SiAlON fluorescent material, a halosilicate fluorescent material, a silicate fluorescent material, a rare earth aluminate fluorescent material, and a sulfide fluorescent material.

12. The light emitting device according to claim 10, wherein the second fluorescent material is at least one kind selected from the group consisting of a β-SiAlON fluorescent material having a composition represented by the following formula (IIa), a halosilicate fluorescent material having a composition represented by the following formula (IIb), a silicate fluorescent material having a composition represented by the following formula (IIc), a rare earth aluminate fluorescent material having a composition represented by the following formula (IId), and a sulfide fluorescent material having a composition represented by the following formula (IIe):

$$Si_{6-t}Al_tO_tN_{8-t}:Eu \quad (IIa)$$

wherein t satisfies 0<t<4.2, $$(Ca,Sr,Ba)_8MgSi_4O_{16}(F,Cl,Br)_2:Eu \quad (IIb)$$

$$(Ba,Sr,Ca,Mg)_2SiO_4:Eu \quad (IIc)$$

$$(Y,Lu,Gd,Tb)_3(Al,Ga)_5O_{12}:Ce \quad (IId)$$

$$(Ba,Sr,Ca)Ga_2S_4:Eu \quad (IIe).$$

13. A method for producing a fluoride fluorescent material including:
 preparing a first solution comprising hydrogen fluoride and at least A that is at least one element or ion selected from the group consisting of alkali metal elements and $NH_4^+$, a second solution comprising hydrogen fluoride and at least a first complex ion including tetravalent manganese and fluorine, and a third solution comprising at least a second complex ion including fluorine and at least one element M selected from the group consisting of Group-4 elements and Group-14 elements; and
 dropping the second solution and the third solution into the first solution respectively to obtain fluoride particles,
 wherein a ratio of a drop amount of each of the second solution and the third solution at each drop point is 0.020% by volume or less per minute for each of the second solution and the third solution relative to an amount of the first solution by volume as 100%.

14. The method for producing a fluoride fluorescent material according to claim 13, wherein the ratio of the drop amount at each drop point is 0.015% by volume or less per minute for each of the second solution and the third solution relative to the amount of the first solution by volume as 100%.

15. The method for producing a fluoride fluorescent material according to claim 13, wherein a volume ratio of a total drop amount of the second solution and the third solution relative to the first solution amount is in a range of 0.4 or more and 1.2 or less.

16. The method for producing a fluoride fluorescent material according to claim 13,
wherein the first solution has a concentration of hydrogen fluoride in a range of 30% by mass or more and 80% by mass or less and a concentration of the A in a range of 1% by mass or more and 30% by mass or less;
the second solution has a concentration of the first complex ion in a range of 0.01% by mass or more and 10% by mass or less; and
the third solution has a concentration of the second complex ion in a range of 10% by mass or more and 60% by mass or less.

17. The method for producing a fluoride fluorescent material according to claim 13, wherein the fluoride fluorescent material has a composition represented by the following formula (I):

$$A_b[M_{1-a}Mn^{4+}{}_aF_6] \qquad (I)$$

wherein A represents at least one element or ion selected from the group consisting of alkali metal elements and $NH_4^+$; M represents at least one element selected from the group consisting of Group-4 elements and Group-14 elements; a satisfies 0<a<0.2; and b is an absolute value of an electric charge of a complex ion represented by $[M_{1-a}Mn^{4+}{}_aF_6]$.

* * * * *